US011581199B2

(12) United States Patent
Hsu et al.

(10) Patent No.: US 11,581,199 B2
(45) Date of Patent: Feb. 14, 2023

(54) WAFER DRYING SYSTEM

(71) Applicant: TAIWAN SEMICONDUCTOR MANUFACTURING CO., LTD., Hsinchu (TW)

(72) Inventors: Wei-Chun Hsu, Taipei (TW); Sheng-Wei Wu, Hsinchu (TW); Shu-Yen Wang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 452 days.

(21) Appl. No.: 16/422,285

(22) Filed: May 24, 2019

(65) Prior Publication Data

US 2020/0135501 A1 Apr. 30, 2020

Related U.S. Application Data

(60) Provisional application No. 62/752,697, filed on Oct. 30, 2018.

(51) Int. Cl.
*H01L 21/67* (2006.01)
*G01N 21/94* (2006.01)

(52) U.S. Cl.
CPC ....... *H01L 21/67034* (2013.01); *G01N 21/94* (2013.01); *H01L 21/67253* (2013.01)

(58) Field of Classification Search
CPC ........ H01L 21/67034; H01L 21/67253; G01N 21/94; F26B 21/14
See application file for complete search history.

(56) References Cited

U.S. PATENT DOCUMENTS

| 5,841,016 | A | * | 11/1998 | Hossain | G01N 23/2251 |
| | | | | | 73/1.01 |
| 10,962,285 | B2 | * | 3/2021 | Hsu | F26B 25/22 |
| 2005/0211267 | A1 | * | 9/2005 | Kao | H01L 21/67051 |
| | | | | | 134/2 |
| 2006/0137726 | A1 | * | 6/2006 | Sano | H01L 21/67769 |
| | | | | | 118/696 |
| 2015/0206780 | A1 | * | 7/2015 | Choi | H01L 21/67017 |
| | | | | | 206/710 |
| 2018/0286726 | A1 | * | 10/2018 | Rebstock | H01L 21/02041 |

FOREIGN PATENT DOCUMENTS

| JP | 2009283853 A | * | 12/2009 | | |
| WO | WO-03077296 A1 | * | 9/2003 | | F26B 25/063 |
| WO | WO-2016043053 A1 | * | 3/2016 | | B01D 53/44 |

* cited by examiner

*Primary Examiner* — Jessica Yuen
(74) *Attorney, Agent, or Firm* — Sterne, Kessler, Goldstein & Fox P.L.L.C.

(57) ABSTRACT

A wafer drying method that detects molecular contaminants in a drying gas as a feedback parameter for a multiple wafer drying process is disclosed. For example, the method includes dispensing, in a wafer drying module, a drying gas over a batch of wafers. Further, the method includes collecting the drying gas from an exhaust of the wafer drying module and determining the concentration of contaminants in the drying gas. The method also includes re-dispensing the drying gas over the batch of wafers if the concentration of contaminants is greater than a baseline value and transferring the batch of wafers out of the wafer drying module if the concentration is equal to or less than the baseline value.

20 Claims, 4 Drawing Sheets

WAFER DRYING SYSTEM

CROSS-REFERENCE TO RELATED APPLICATION

This application claims the benefit of U.S. Provisional Patent Application No. 62/752,697, titled "Wafer Drying System," which was filed on Oct. 30, 2018 and is incorporated herein by reference in its entirety.

BACKGROUND

Production equipment used in semiconductor manufacturing can be a source of particles for wafers in an integrated circuit (IC) fabrication facility. During the wafer fabrication process, semiconductor wafers undergo numerous processing operations. The number of particles on a wafer's surface can increase during IC fabrication as the wafer is exposed to additional processing.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1A:
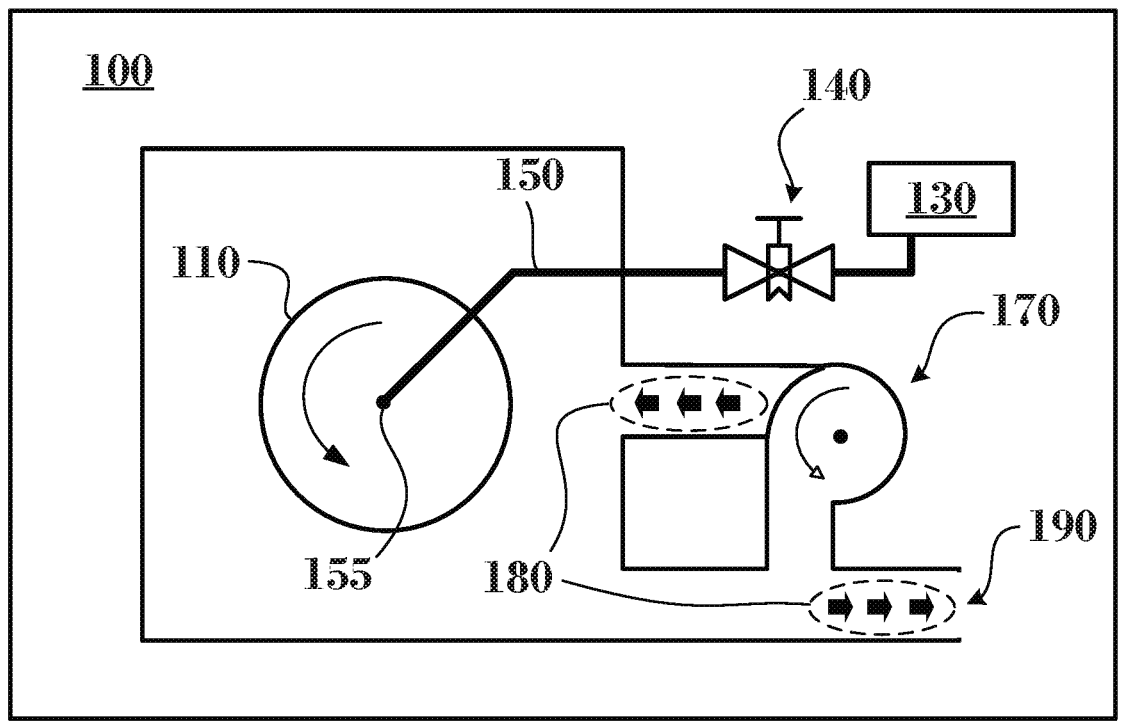
FIG. 1A is a schematic view of a multi-wafer drying module, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value).

The term "vertical," as used herein, means nominally parallel to the z-axis and perpendicular to the x-y plane.

One way to control wafer contamination from particles is to prevent contaminating the wafer during processing. However, this is not always possible, and once the wafer is contaminated, the contaminants may be removed by cleaning. The goal for the wafer cleaning process is to remove wafer surface contaminants, such as particles, organics (e.g., organic byproducts), metallics (traces of metals), and native oxides. The wafers in semiconductor manufacturing environment can be cleaned by dry cleaning methods, wet cleaning methods, or combinations thereof.

Wet cleaning methods can be performed in wet tools, which can handle either one wafer at a time (e.g., "single-wafer" tools) or large batches of wafers at once (e.g., "batch tools"). In a batch tool configuration, multiple wafers (e.g., a batch of wafers) are positioned on a multiple wafer ("multi-wafer") holder and are submerged into a series of sequential cleaning baths. The cleaning baths remove the targeted contamination (e.g., particles, metallic contaminants, organic material, etc.) from the surface of the wafers. After the cleaning process, the wafers are rinsed with de-ionized (DI) water (e.g., submerged into a bath that contains DI water) and moved to a multi-wafer drying module that dries the wafers via spinning, while an inert gas (such as nitrogen; helium; or clean dry air with a moisture content below −73° C. dew point, less than 1 part per million carbon dioxide, and/or less than 0.003 parts per million hydrocarbon vapor) is flown over the surface of the wafers to accelerate the drying process.

Once the drying process is completed, the wafers can be removed from the wet cleaning tool. One or more wafers can be selected (e.g., randomly selected) to be screened for contaminants and particles to assess the efficiency of the wet cleaning process. The term "contaminants," as used herein, can either refer to chemical traces from the wet cleaning solutions used in the wet cleaning and drying processing (e.g., water spots, acids, derivatives of ammonia, etc.).

If the concentration of contaminants (e.g., the contamination level) on the wafer is greater than an established baseline, the wafers can be subjected to an additional drying cycle or discarded from the production line. The term "established baseline," as used herein, refers to a contamination level that has been deemed to have minimal impact on subsequent processing operations or have any appreciable impact on die yield loss. The aforementioned process can be both time consuming and costly because the contamination level is not measured concurrently (in real time) with the drying process—for example, the sampling process described above requires that the wafers are removed from the wet cleaning tool after the drying process, measured on a different tool (e.g., at a different location in the fabrication facility), and then returned to the wet cleaning tool for additional drying, if necessary. In some cases, analysis for one or more selected wafers can consume a substantial amount of time (e.g., one or more hours), which impacts the overall chip production throughput.

This disclosure is directed to a multi-wafer drying method that utilizes a real-time detection methodology to detect contaminants dissolved or incorporated in a drying gas as a feedback parameter for the multi-wafer drying method. More specifically, the method includes collecting the used drying gas from a multi-wafer drying module, analyzing the drying gas to determine its airborne molecular contamination concentration, and comparing the concentration to an established baseline.

Based on the results of the comparison, the method can adjust the wafer drying process. For example, if the concentration of airborne molecular contamination in the drying gas is equal to or less than the established baseline, the wafers can be removed from the drying module and transferred to the next processing operation. If the concentration of airborne molecular contamination is greater than the established baseline, an additional dry cycle can be performed on the wafers or the drying time can increase. Airborne molecular contamination refers to chemical contamination that can be incorporated or dispersed into the drying gas in the form of vapors or aerosols. These chemicals can be organic or inorganic and can include acids, bases, polymer additives, organometallic compounds, dopants, and the like. By way of example and not limitation, the airborne molecular contamination can include volatile organic compounds, amines, inorganic acids, acetone, sulfur dioxide ($SO_2$), isopropyl alcohol (IPA), water (humidity), or any combination thereof.

FIG. 1A is a schematic view (e.g., a front view) of a multi-wafer drying module 100. In some embodiments, multi-wafer drying module 100 is a module on a wet cleaning cluster tool (not shown in FIG. 1A for simplicity). The wet cleaning cluster tool can include additional components, such as additional modules (e.g., transfer modules, one or more wet cleaning baths, one or more rinsing baths, etc.), robotic arms, pumps, exhaust lines, heating elements, gas and chemical delivery lines, mass flow controllers, gate valves, slot valves, hoses, external and internal electrical connections to other components of the cluster tool—such as computer units, chemical analyzers, controller units, pressure controllers, valves, pumps, and the like. These additional components may or may not be depicted in FIG. 1A for ease of illustration. However, these components are within the spirit and scope of this disclosure.

Figure 1B:
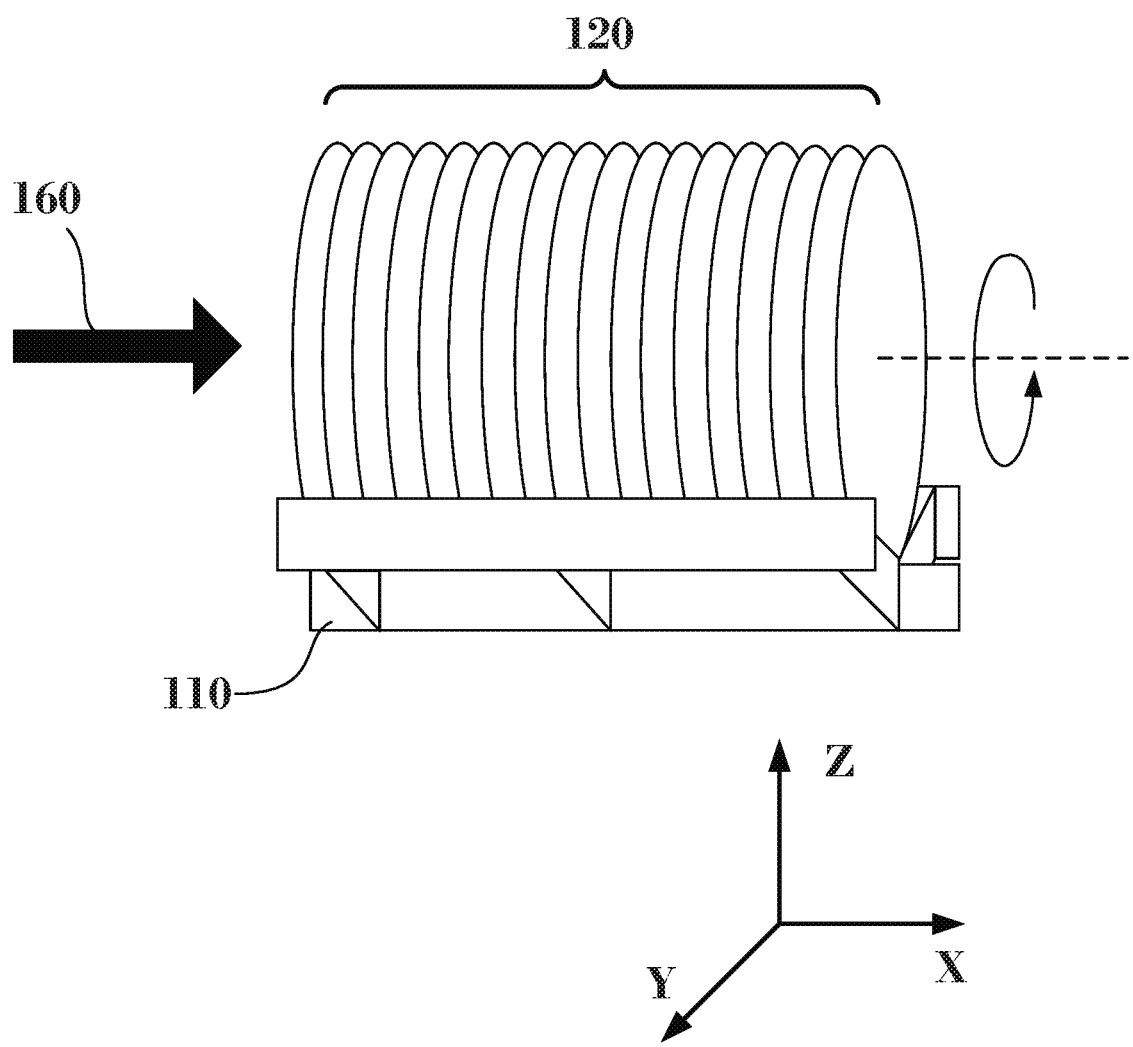
FIG. 1B is a schematic view of multi-wafer holder of a multi-wafer drying module, according to some embodiments.

In multi-wafer drying module 100, one or more wafers (not shown in FIG. 1A) are stacked laterally along the x-axis on a multi-wafer holder 110, according to some embodiments. Multi-wafer holder 110 is configured to spin the wafers around the x-axis at about 800 revolutions per second (rev/s) during each drying process. By way of example and not limitation, a side view of multi-wafer holder 110—which is loaded with wafers 120—is shown in FIG. 1B. In some embodiments, multi-wafer holder 110 can hold between 1 and 25 wafers. In referring to FIG. 1A, multi-wafer drying module 100 features a drying gas distribution system that includes at least a drying gas box 130, a gas valve 140, and a gas distribution line 150. In some embodiments, a drying process involves spinning the wafers at a predetermined speed (e.g., at about 800 rev/s) and concurrently dispensing the drying gas towards the surface of the wafers at a predetermined rate. For example, while the wafers are spinning, drying gas from drying gas box 130 is dispensed via gas outlet 155 in multi-wafer holder 110 and directed towards the top surface of the wafers (e.g., along the x-axis), as indicated by flow arrow 160 in FIG. 1B. However, the position of gas outlet 155 in multi-wafer holder 110 is not limited to the position shown in FIG. 1A, and other positions of gas outlet 155 are possible. For example, gas outlet 155 may be positioned on the sides of multi-wafer holder 110 so that the drying gas can flow along the y-axis, z-axis (e.g., parallel to the top surface of wafers 120 in FIG. 1B), or any combinations thereof. Further, multiple gas outlets, like gas outlet 155, at different locations are possible. A fan unit 170 can circulate the drying gas within the volume of multi-wafer drying module 100, as indicated by flow arrows 180. During the spin drying process, a volume of the circulated drying gas exits multi-wafer drying module 100 via exhaust line 190. Drying gases that can be used in the wafer drying process include, but are not limited to, inert gases such as nitrogen, helium, and argon. Alternatively, clean dry air can be used as a drying gas.

In some embodiments, multi-wafer module 100 may be configured to dry wafers that are stacked vertically (e.g., along the z-axis of FIG. 1B) instead of being stacked laterally (e.g., along the x-axis as shown in FIG. 1B) on multi-wafer holder 110. Additionally, multi-wafer module 100 may be configured to dry multiple wafers at a time (e.g., 2, 4, 6, 8, 10, 15, 20, 25). In some embodiments, multi-wafer module 100 may be configured to accept more than one multi-wafer holder 110 at a time.

By way of example and not limitation, gas box 130 can be fluidly connected to one or more tanks (not shown in FIG. 1A) that contain respective drying gases in high purity (e.g., above 99.999%) and under pressure. These tanks can be part of a gas distribution system, where a network of gas valves and gas distribution lines are housed. The external tanks and their connections are not shown in FIG. 1A for simplicity.

Since the drying gas comes in contact with wafers 120 in multi-wafer drying module 100, traces of chemical signatures from the wet cleaning process can be incorporated, dissolved, or dispersed in the drying gas in the form of airborne molecular contamination. By measuring the concentration of the airborne contamination in the drying gas, embodiments of the present disclosure determine whether the wafers need to undergo another drying cycle in multi-wafer drying module 100, or whether the wafers can be removed from multi-wafer drying module 100 and proceed to the next processing operation.

As discussed above, and referring to FIG. 1A, multi-wafer drying module 100 includes an exhaust line 190 through which the drying gas can exit multi-wafer drying module 100. However, this is not limiting and multi-wafer drying module 100 can be equipped with additional exhaust lines.

Figure 2:
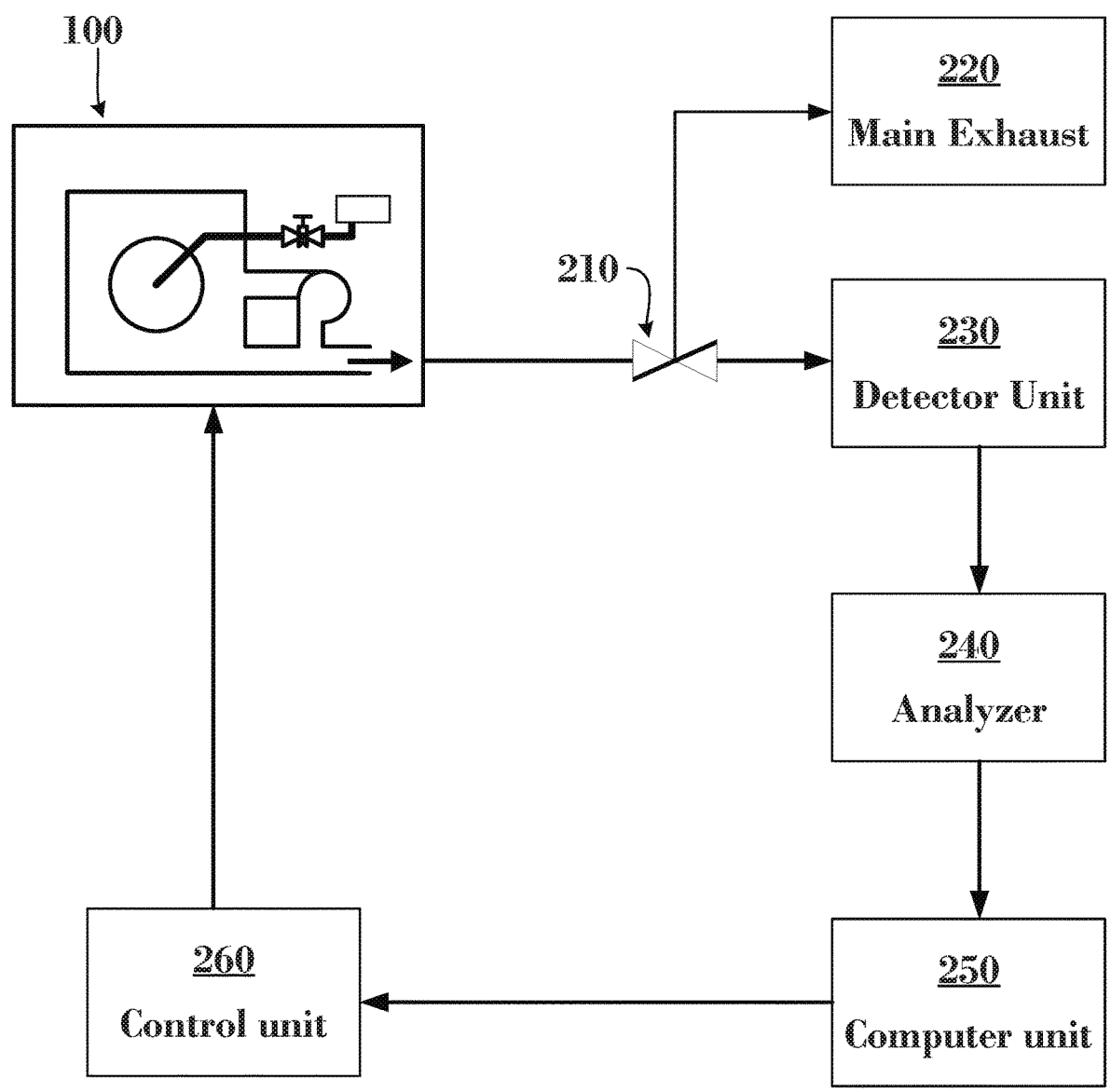
FIG. 2 is a multi-wafer drying system, according to some embodiments.

FIG. 2 is a multi-wafer drying system configured to analyze the drying gas from multi-wafer drying module 100 and, based on the results of the analysis, to send commands to multi-wafer drying module 100, according to some embodiments. The multi-wafer drying system of FIG. 2 includes the following components: multi-wafer drying module 100, a valve 210, a main exhaust 220, a detector unit 230, an analyzer 240, a computer unit 250, and a control unit 260. The multi-wafer drying system of FIG. 2 can include additional components, which are not shown in FIG. 2 for simplicity. These components can include, but are not limited to, gas lines, additional valves, vacuum pumps, additional electronic equipment, etc.

In some embodiments, valve 210 is a "two-way" valve that diverts the flow of drying gas from main exhaust 220 to detector unit 230. By way of example and not limitation, main exhaust 220 can be a gas scrubber system or an air pollution control device. Detector unit 230 can be an intermediate station, where the drying gas can be chemically identified and temporarily stored until a predetermined volume of drying gas has been collected. For example, detector unit 230 can determine whether the drying gas is nitrogen, helium, argon, clean dry air, or another gas. In some embodiments, one or more detector units 230 may collect drying gases from respective one or more multi-wafer drying modules, like multi-wafer drying module 100.

In some embodiments, analyzer 240 is a device configured to detect multiple types of airborne molecular contaminants diluted in the drying gas. In other embodiments, analyzer 240 may be limited to detecting a single type of airborne molecular contaminants (e.g., volatile organic compounds). In this case, one or more analyzers 240 may be required for the detection of additional types of airborne molecular contaminants dissolved in the drying gas (e.g., for inorganic contaminants). Further, analyzer 240 can be configured to receive drying gas samples from one or more detector units 230. In some embodiments, one or more analyzers 240 can be disposed within, or be part of, detector unit 230. By way of example and not limitation, analyzer 240 includes a time of flight mass spectrometer (TOFMS) for volatile organic compound detection, an ion mobility spectrometer for amine and acid detection, detectors for sulfuric oxide detection, humidity detectors, detectors to detect airborne molecular contaminants of interest, or combinations thereof. In some embodiments, analyzer 240 can provide concentration levels of airborne molecular contaminants that are incorporated (e.g., dissolved) into the drying gas in parts per million (ppm), parts per billion (ppb), in atomic percentage (at. %), in a percentage by volume, or other suitable units.

In some embodiments, computer unit 250 is configured to receive the concentration levels of airborne molecular contaminants from analyzer 240 and compare them to an established baseline. For example, the established baseline can include "allowed" or "acceptable" levels of contamination for each of the airborne molecular contaminants that are dissolved or incorporated in the collected drying gas. By way of example and not limitation, each of the allowed or acceptable levels of contamination can be determined from a correlation between historical contamination data and the impact of each contaminant on chip yield. Alternatively, each of the allowed or acceptable levels of contamination can be determined from a correlation between historical contamination data and the impact of each contaminant on subsequent operations or processes. The allowed level for each type of airborne molecular contaminant can be different—for example, depending on the impact of each type of airborne molecular contaminant on chip yield or on subsequent processing. For example, the allowed humidity levels in the drying gas can be greater than, or less than, the allowed levels of volatile organic compounds. Further, the established baseline can be adjusted depending on the type of airborne molecular contaminants and the contaminant's impact on chip yield or the overall chip yield goals. By way of example and not limitation, the established baseline can be one or more stored values in a local (or remote) database or in a local (or remote) server.

By way of example and not limitation, computer unit 250 shown in FIG. 2 can be integrated with multi-wafer drying module 100 or it can be an integral part of the cluster tool that includes multi-wafer drying module 100 and additional modules. Computer unit 250 can be part of a network system that collects and analyzes data from a variety of sources across the fabrication facility, such as, but not limited to, cluster tools, pressure sensors, analytical tools, mass flow controllers, and the like. In some embodiments, computer unit 250 can be configured to receive output data from one or more analyzers 240, compare the output data to baseline data, and send commands to other units or modules based on the results of the comparative analysis. For example, computer unit 250 can be configured to send commands to control unit 260.

In some embodiments, control unit 260 can be a communication interface between computer unit 250 and multi-wafer drying module 100. In some embodiments, control unit 260 can be integrated with (e.g., a part of) a wet cleaning cluster tool, in which multi-wafer drying module 100 belongs to.

Figure 3:
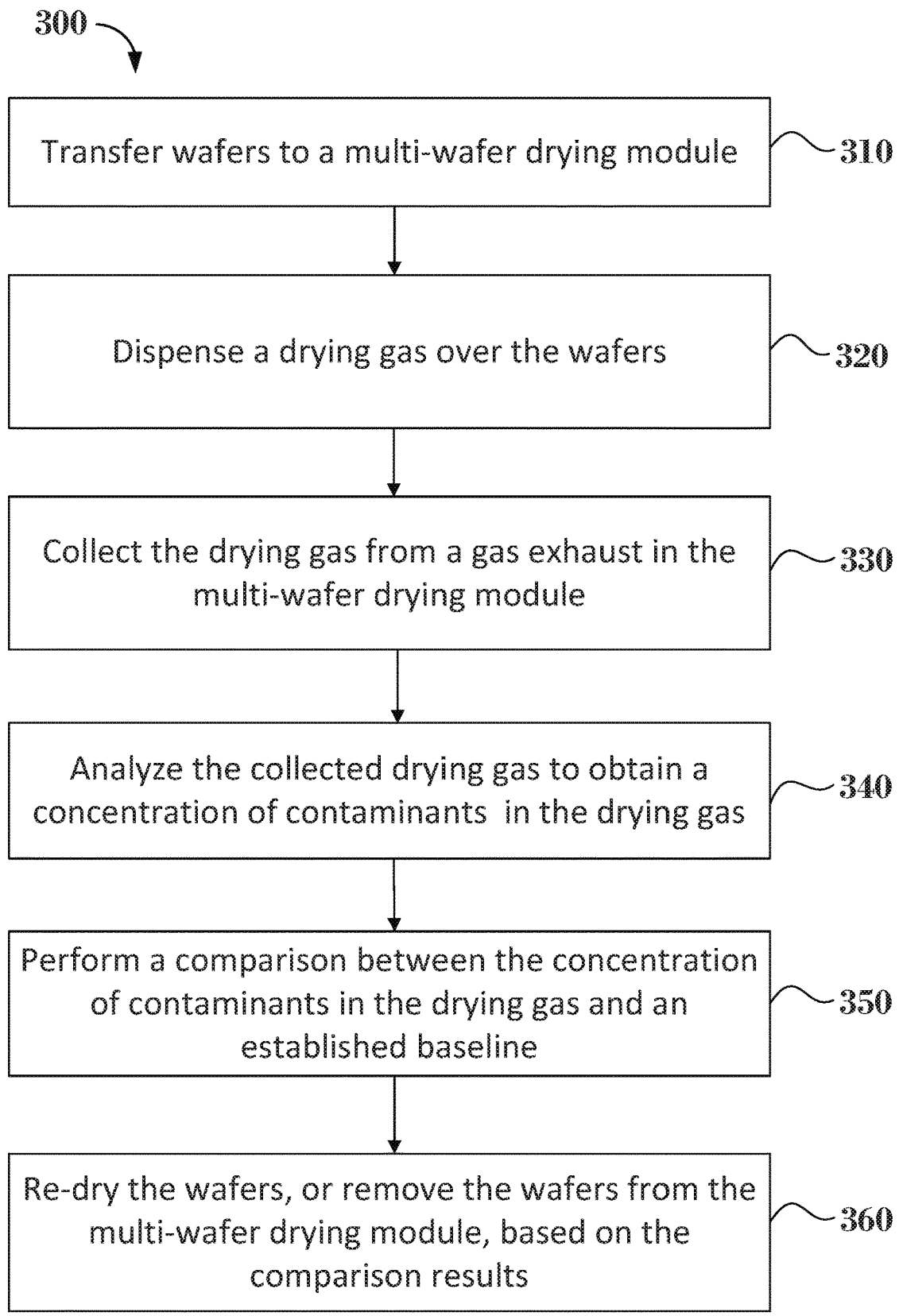
FIG. 3 is flow chart of a wafer drying method for a multi-wafer drying module, according to some embodiments.

FIG. 3 is a flow chart of a multi-wafer drying method 300 ("wafer drying method 300") that detects airborne molecular contaminants in a drying gas used in a multi-wafer drying module, according to some embodiments. Based on the detected levels of the airborne contamination, wafer drying method 300 can be modified. In some embodiments, wafer drying method 300 can be performed in a multi-wafer drying module (e.g., multi-wafer drying module 100 shown in FIG. 1A) in real time (e.g., while the wafers are dried) or after the end of the drying process. Further, this disclosure is not limited to this operational description. Rather, other operations are within the spirit and scope of the present disclosure. It is to be appreciated that additional operations may be performed. Moreover, not all operations may be needed to perform the disclosure provided herein. Additionally, some of the operations may be performed simultaneously, or in a different order than shown in FIG. 3. In some embodiments, one or more other operations may be performed in addition to or in place of the presently described operations. For illustrative purposes, wafer drying method 300 is described with reference to the embodiments shown in FIGS. 1A, 1B, and 2. Based on the disclosure herein, other configurations of multi-wafer drying module 100 can be used with wafer drying method 300 as long as at least one drying gas is participating in the wafer drying process. These multi-wafer drying modules and their configurations are within the spirit and scope of this disclosure.

Wafer drying method 300 begins with operation 310, where wafers 120 (as shown in FIG. 1B) are loaded into a multi-wafer wafer holder 110 of multi-wafer drying module 100, as shown in FIG. 1B. By way of example and not limitation, wafers 120 can be transferred to multi-wafer drying module 100 from a transfer module, a wet cleaning bath, a rinsing bath, or from another module—all of which are not shown in FIGS. 1A, 1B, and 3 for simplicity. As discussed above, multi-wafer drying module 100 can be integrated in a cluster tool or can be a standalone unit. The cluster tool can be a wet cleaning tool that includes one or more cleaning baths/stations, one or more rinsing baths/stations, other modules (e.g., transfer modules), mechanical equipment, pneumatic equipment, electrical equipment, or other equipment. In some embodiments, wafers 120 are transferred to multi-wafer drying module 100 from a rinsing bath/station.

In operation 320 of wafer drying method 300, the wafers are spun (e.g., at about 800 revs/s) and a drying gas is dispensed through gas outlet 155 of multi-wafer holder 110 towards wafers 120. In some embodiments, the drying gas is dispensed along the x-axis (e.g., perpendicular to the top surface of wafers 120) as shown by flow arrow 160 in FIG. 1B. In some embodiments, the drying gas can be dispensed along the y- or z-axis—e.g., parallel to the wafers' top and bottom surfaces as shown in FIG. 1B. Fan unit 170 circulates the drying gas within multi-wafer module 100 to expedite the drying process. As shown in FIG. 1A, a portion of the drying gas exits multi-wafer drying module 100 via exhaust line 190. By way of example and not limitation, the drying gas can include an inert gas such as nitrogen, helium, or argon. Alternatively, the drying gas can include dry clean air.

As the drying gas travels along the surface of spinning wafers 120, airborne molecular contaminants can be incorporated, dissolved, or suspended in the drying gas. In other words, the drying gas can function as a "carrier gas" that transports the airborne molecular contaminants away from the wafers' surfaces, but does not chemically react with them. By way of example and not limitation, the airborne molecular contaminants can include volatile organic compounds, derivatives of ammonia (e.g., amines), acids (such as hydrofluoric acid, hydrochloric acid, etc.), acetone, sulfur dioxide, isopropyl alcohol, water, other types of chemicals, or combinations thereof that have been used in one or more prior wafer wet cleaning operations (e.g., in one or more cleaning baths or in one or more rinsing baths). Based on the type of airborne molecular contaminants to be detected, an appropriate drying gas can be selected. For example, the drying gas should not chemically react with the airborne molecular contaminants because such reaction can result in the formation of deposits on the wafers' surfaces or change the chemical signature of the airborne molecular contaminants. For example, dry clean air may not be appropriate for certain categories of airborne molecular contaminants due to its reactivity.

Wafer drying method 300 continues with operation 330, where the drying gas is collected from a module's exhaust line, such as exhaust line 190 shown in FIG. 1A. In referring to FIG. 2, the drying gas can be diverted from main facility exhaust 220 (e.g., via valve 210) and collected to detector unit 230, according to some embodiments. In operation 330 the collection of the drying gas can be performed in real time (e.g., as wafers 120 are dried in multi-wafer drying module 100) or after the end of the drying process.

In operation 340 of wafer drying method 300, the collected drying gas can be analyzed to obtain a concentration of contaminants incorporated in the drying gas. As discussed above, the contaminants are airborne molecular contaminants dissolved in the drying gas. The airborne molecular contaminants can subsequently be identified and quantified. For example, and referring to FIG. 2, the drying gas is transferred from detector unit 230 to one, or more, analyzers 240. As discussed above, a single analyzer 240 can be configured to receive samples of drying gas from one or more detector units 230. In some embodiments, one or more analyzers 240 can be disposed within or be part of detector unit 230. In some embodiments, analyzer 240 is configured to analyze the drying gas and subsequently provide the concentration levels of the airborne molecular contaminants incorporated or dissolved in the drying gas.

In referring to FIGS. 2 and 3 and operation 350 of wafer drying method 300, the concentration data of the airborne molecular contaminants from analyzer 240 can be sent to a computer unit 250, where the concentration data are compared to a baseline (e.g., allowed levels for each contaminant). As discussed above, each of the allowed or acceptable levels of contamination can be determined from a correlation between historical contamination data and the impact of each contamination on chip yield or on subsequent operations.

In operation 360 of wafer drying method 300, wafers 120 can be re-dried or be removed from multi-wafer drying module 100 based on the comparison analysis performed in operation 350. In some embodiments, the re-dry process can include subjecting wafers 120 to another drying operation (drying cycle) in multi-wafer drying module 100 (e.g., if the drying gas analysis is performed after the end of the drying operation) or to extend the ongoing drying process (e.g., if the drying gas analysis is performed in real time and while the wafers are dried). For example, referring to FIG. 2, computer unit 250 can send one or more commands to a control unit 260 to re-dry wafers 120 or remove wafers 120 from multi-wafer drying module 100. As discussed above, control unit 260 can be a communication interface between computer unit 250 and multi-wafer drying module 100. In some embodiments, control unit 260 can be integrated with (e.g., a part of) a wet cleaning cluster tool, in which multi-wafer drying module 100 belongs to.

In some embodiments, if the concentration of the airborne molecular contaminants in the drying gas is equal to or less than the allowed level, wafers 120 can be removed from drying module 100. On the other hand, if the concentration of the airborne molecular contaminants in the drying gas is greater than the allowed level, wafers 120 can be subjected to a second drying process or extend the ongoing drying process. For example, if the concentration of volatile organic compounds, amines, or sulfuric oxide is greater than the allowed level for these contaminants, computer unit 250 can command control unit 260 to subject the wafers to a second drying process in multi-wafer drying module 100 or extend the ongoing drying process. The second drying process can include spinning the wafers in drying module 100 and disposing drying gas over the spinning wafers (e.g., repeating the drying process).

In some embodiments, after the second drying process, the drying gas used in the second drying operation can be analyzed for airborne molecular contaminants according to the operations of wafer drying method 300. This means that if the concentration of the airborne molecular contaminants in the drying gas is equal to or less than the allowed level, wafers 120 can be removed from drying module 100. On the other hand, if the concentration of the airborne molecular contaminants in the drying gas is greater than the allowed level, wafers 120 can be subjected to a third drying process or the ongoing drying process can be further extended. Operations 320 through 360 of wafer drying method 300 can be repeated as necessary until the targeted contaminants detected in the drying gas are equal to or less than the allowed level. Once this is met, wafers 120 can move to the next operation.

This disclosure is directed to a multi-wafer wafer drying method that detects airborne molecular contaminants, which are dispensed or dissolved in a drying gas that has been used in a multi-wafer drying process. According to some embodiments, the multi-wafer drying method can be performed in real time (e.g., while the wafers are dried) or at the end of the drying process. The multi-wafer drying method utilizes the measured concentration of airborne molecular contaminants as a feedback parameter to control the multi-wafer drying process. More specifically, the method includes collecting the drying gas from a multi-wafer drying module, analyzing the drying gas to determine its airborne molecular contamination concentration, and comparing the concentration to one or more allowed levels. According to some embodiments, the airborne molecular concentration of contaminants detected in the drying gas is an indicator of the concentration of contaminants on the surface of the wafers. According to the comparison results, the method can make adjustments to the wafer drying process. For example, if the concentration of airborne molecular contamination is greater than the allowed level, the wafers can be subjected to an additional drying operation or the ongoing drying process can be extended. In some embodiments, the airborne molecular contamination includes, but is not limited to, volatile organic compounds, amines, inorganic acids, acetone, sulfur dioxide ($SO_2$), isopropyl alcohol (IPA), water (humidity), etc. In some embodiments, the drying gas includes, but is not limited to, nitrogen, argon, helium, clean dry air, or any other suitable gas that does not chemically react with the airborne molecular contaminants to form deposits on the wafers.

In some embodiments a wafer drying system includes a wafer drying module configured to spin a batch of wafers and to dispense a drying gas over the batch of wafers; an analyzer configured to detect molecular contaminants dispersed in the drying gas from the wafer drying module and to determine a concentration of the molecular contaminants; and circuitry that is configured to: (i) compare the concentration of the molecular contaminants to a baseline value, and (ii) in response to the concentration being greater than the baseline value, command the wafer drying module to re-spin and flow additional drying gas over the batch of wafers.

In some embodiments, a method of drying a batch of wafers includes spinning the batch of wafers in a wafer drying module; dispensing, in the wafer drying module, a drying gas over the batch of wafers; collecting the drying gas from an exhaust line of the wafer drying module and analyzing the collected drying gas to determine a concentration of contaminants dissolved in the drying gas. The method further includes that in response to the concentration of contaminants being greater than a baseline value, re-spinning the batch of wafers while re-dispensing the drying gas over the batch wafers; and in response to the concentration being equal to or less than the baseline value, transferring the batch of wafers outside the wafer drying module.

In some embodiments, a multiple wafer drying system includes a wafer drying module configured to dry a plurality of wafers by spinning the plurality of wafers and dispensing a drying gas over the plurality of wafers; a detector configured to collect, from an exhaust line of the wafer drying module, the drying gas dispensed over the plurality of wafers; an analyzer configured to analyze the collected drying gas and to output a concentration of one or more airborne molecular contaminants in the drying gas. The multiple wafer drying system further includes circuitry configured to compare the concentration of the one or more airborne molecular contaminants to respective one or more baseline values. The circuitry, in response to the concentration of the one or more airborne molecular contaminants being equal to or less than the respective one or more baseline values, commands the wafer drying module to remove the plurality of wafers from the drying module. Further, the circuitry, in response to the concentration of the one or more airborne molecular contaminants being greater than the respective one or more baseline values, commands the wafer drying module to re-spin the plurality of wafers and re-dispense the drying gas over the plurality of wafers.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A wafer drying system, comprising:
   a multi-wafer holder configured to spin a batch of wafers and comprising:
      a gas distribution line extending from a drying gas box toward a center portion of an outermost wafer of the batch of wafers; and
      a gas outlet placed adjacent to the center portion to dispense a drying gas over the batch of wafers;
   an analyzer configured to detect contaminants dispersed in the drying gas from the multi-wafer holder and to determine a concentration of the contaminants; and
   a computer configured to:
      compare the concentration of the contaminants to a baseline value; and
      in response to the concentration of the contaminants being greater than the baseline value, command the multi-wafer holder to spin and flow drying gas over the batch of wafers for another cycle.

2. The wafer drying system of claim 1, wherein the computer is further configured to, in response to the concentration of the contaminants being equal to or less than the baseline value, command the multi-wafer holder to remove the batch of wafers.

3. The wafer drying system of claim 1, wherein the contaminants are inorganic acids, acetone, or isopropyl alcohol.

4. The wafer drying system of claim 1, wherein the drying gas is an inert gas or dry air.

5. The water drying system of claim 4, wherein the inert gas is nitrogen, argon, or helium.

6. The wafer drying system of claim 1, wherein the analyzer is a time of flight mass spectrometer or an ion mobility spectrometer.

7. The wafer drying system of claim 1, further comprising:
   a cluster tool that houses the multi-wafer holder and the computer; and
   a detector configured to collect the drying gas from the multi-wafer holder and to transfer the collected drying gas to the analyzer.

8. The wafer drying system of claim 1, wherein the computer is further configured to, in response to the concentration of the contaminants being greater than the baseline value, command the multi-wafer holder to start another spin and drying cycle of the batch of wafers.

9. The wafer drying system of claim 1, wherein the multi-wafer holder further comprises a fan to circulate the drying gas toward an exhaust line of the multi-wafer holder, wherein the fan is lower than the batch of wafers.

10. A method of drying a batch of wafers, comprising:
    spinning the batch of wafers by a multi-wafer holder;
    dispensing, in the multi-wafer holder, a drying gas over the batch of wafers;
    collecting the drying gas from an exhaust line of the multi-wafer holder;

analyzing the collected drying gas to determine a concentration of inorganic acids, acetone, or isopropyl alcohol dissolved in the drying gas;

in response to the concentration of the inorganic acids, acetone, or isopropyl alcohol being greater than a baseline value, spinning the batch of wafers for another cycle while dispensing additional drying gas over the batch of wafers; and in response to the concentration of the inorganic acids, acetone, or isopropyl alcohol being equal to or less than the baseline value, transferring the batch of wafers outside the multi-wafer holder.

11. The method of claim 10, wherein determining the concentration of the inorganic acids, acetone, or isopropyl alcohol comprises determining the concentration of the inorganic acids, acetone, or isopropyl alcohol by a time of flight mass spectrometer or an ion mobility spectrometer.

12. The method of claim 10, wherein dispensing the drying gas comprises dispensing a chemically inert gas relative to inorganic acids, acetone, or isopropyl alcohol.

13. The method of claim 10, wherein the drying gas is nitrogen, argon, helium, or dry air.

14. The method of claim 10, further comprising:
after continuing to spin the batch of wafers while dispensing the additional drying gas over the batch of wafers, collecting the additional drying gas from the multi-wafer holder;

analyzing the collected additional drying gas to determine an other concentration of the inorganic acids, acetone, or isopropyl alcohol in the collected additional drying gas;

in response to the other concentration of the inorganic acids, acetone, or isopropyl alcohol being greater than the baseline value, performing another spinning of the batch of wafers while dispensing further drying gas over the batch of wafers; and in response to the other concentration of the inorganic acids, acetone, or isopropyl alcohol being equal to or less than the baseline value, transferring the batch of wafers outside the multi-wafer holder.

15. A multiple wafer drying system, comprising:
a multi-wafer holder configured to spin a plurality of wafers and comprising a gas outlet to dispense a drying gas over the plurality of wafers;

an analyzer configured to analyze the drying gas collected from an exhaust line of the multi-wafer holder and to output a concentration of one or more contaminants in the drying gas; and a computer configured to:
compare the concentration of the one or more contaminants to respective one or more values;

in response to the concentration of the one or more contaminants being equal to or less than the respective one or more values, command the multi-wafer holder to remove the multi-wafer holder; and in response to the concentration of the one or more contaminants being greater than the respective one or more values, command the multi-wafer holder to start another spinning and drying cycle of the multi-wafer holder.

16. The multiple water drying system of claim 15, wherein the drying gas is a carrier gas for the one or more contaminants.

17. The multiple wafer drying system of claim 15, wherein the analyzer is a time of flight mass spectrometer or an ion mobility spectrometer.

18. The multiple wafer drying system of claim 15, wherein the one or more contaminants are inorganic acids, acetone, or isopropyl alcohol.

19. The multiple wafer drying system of claim 15, wherein the drying gas is nitrogen, helium, argon, or dry air.

20. The multiple wafer drying system of claim 15, wherein the gas outlet dispenses the drying gas toward a surface of an outermost wafer of the plurality of wafers.

* * * * *